(12) United States Patent
Chou

(10) Patent No.: US 8,018,262 B1
(45) Date of Patent: Sep. 13, 2011

(54) DUTY CYCLE CORRECTION CIRCUIT

(75) Inventor: Min Chung Chou, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 64 days.

(21) Appl. No.: 12/728,812

(22) Filed: Mar. 22, 2010

(51) Int. Cl.
*H03K 3/017* (2006.01)
*H03K 5/04* (2006.01)
*H03K 7/08* (2006.01)

(52) U.S. Cl. ......... 327/175; 327/164; 327/170; 327/172

(58) Field of Classification Search ............ 327/170, 327/172, 175
See application file for complete search history.

(56) References Cited

U.S. PATENT DOCUMENTS

| 7,428,286 B2 | 9/2008 | Kim |
| 7,576,581 B2 | 8/2009 | Shin et al. |
| 2009/0058481 A1* | 3/2009 | Kim et al. ............... 327/175 |

* cited by examiner

*Primary Examiner* — Lincoln Donovan
*Assistant Examiner* — John Poos
(74) *Attorney, Agent, or Firm* — WPAT, P.C.; Anthony King

(57) ABSTRACT

A duty cycle correction circuit comprises first and second pulse generators, a clock dividing unit, a detecting unit, and a pulse width control unit. The first pulse generator is configured to generate a first edge of a first pulse signal in synchronization with a first edge of a first clock signal, and the second pulse generator is configured to generate a first edge of a second pulse signal in synchronization with a second edge of the first pulse signal. The clock dividing unit is configured to generate a second clock signal by dividing the frequency of the first clock signal. The detecting unit is configured to generate a detecting signal according to the second clock signal and a time interval between the first edge of the first pulse signal and a second edge of the second pulse signal. In particular, pulse widths of the first and second pulse signals are the same and are adjustable according to a control signal from the pulse width control unit.

16 Claims, 8 Drawing Sheets

DUTY CYCLE CORRECTION CIRCUIT

BACKGROUND OF THE INVENTION

1. Field of the Invention

The present invention relates to a duty cycle correction circuit for providing a clock signal with a half duty cycle or a one-Nth duty cycle.

2. Description of the Related Art

Generally, a delay locked loop (DLL) is used in a synchronous semiconductor memory device, such as a double data rate synchronous dynamic random access memory (DDR SDRAM), to perform synchronization between an internal clock signal and an external clock signal of the synchronous semiconductor memory device. A DDR SDRAM employs a rising edge and a falling edge of a clock signal to process data so as to increase the operation speed of data. As the operational speed of the DDR SDRAM is increased, performance of the DDR SDRAM is greatly affected by the DLL. Therefore, since design margin decreases with an increase of duty error, having a correct duty cycle of the internal clock is important. Reliable data transmission is achieved when the duty cycle is equivalent to 50%, and a duty cycle correction circuit applied to the DLL is required for ensuring sufficient design margin of the duty cycle.

U.S. Pat. No. 7,576,581 provides a circuit for correcting a duty cycle. The circuit configured to correct a duty cycle includes a digital conversion block, a duty ratio information analyzing block, and a duty ratio control block. An output clock signal having a duty cycle equivalent to 50% is obtained by mixing phases of rising and falling clock signals rclk and fclk with a phase mixing unit, wherein the signal fclk is generated by controlling a falling edge of a selected delayed clock signal and the signal rclk is generated by controlling a falling edge of an input clock signal. U.S. Pat. No. 7,428,286 provides an apparatus for correcting duty cycle of clock signals used in semiconductor memories. The duty cycle correction apparatus comprises a delay line block, a DCC phase mixer, a phase mixer controller and a phase comparator. The DCC phase mixer corrects a duty cycle of an external clock signal to 50% by mixing an external inversion clock signal and a delay line output inversion clock signal. The aforementioned circuits all require a phase mixer to correct the duty cycle of a clock signal. However, the phase mixer comprises a plurality of drivers to implement pull-up and pull-down functions, and therefore consumes a large amount of power and requires a large silicon area.

Accordingly, there is a need to provide a circuit and method for correcting the duty cycle of a clock signal. The corrected duty cycle can be employed in a synchronous semiconductor memory device, such as a DDR SDRAM, to improve operation efficiency.

SUMMARY OF THE INVENTION

An aspect of the present invention is to provide a duty cycle correction circuit for generating a clock signal with a half duty cycle.

According to one embodiment of the present invention, the duty cycle correction circuit comprises first and second pulse generators, a clock dividing unit, a detecting unit, and a pulse width control unit. The first pulse generator is configured to generate a first edge of a first pulse signal in synchronization with a first edge of a first clock signal, and the second pulse generator is configured to generate a first edge of a second pulse signal in synchronization with a second edge of the first pulse signal. The clock dividing unit is configured to generate a second clock signal by dividing the frequency of the first clock signal. The detecting unit is configured to generate a detecting signal according to the second clock signal and a time interval between the first edge of the first pulse signal and a second edge of the second pulse signal. The pulse width control unit is configured to generate a control signal according to the detecting signal, the first clock signal, and the second clock signal. In particular, pulse widths of the first and second pulse signals are the same and are adjustable according to the control signal.

Another aspect of the present invention is to provide a duty cycle correction circuit for generating a clock signal with a one-Nth duty cycle.

According to one embodiment of the present invention, the duty cycle correction circuit comprises a plurality of pulse generators, a clock dividing unit, a detecting unit, and a pulse width control unit. The plurality of pulse generators are connected in series and are configured to individually generate a plurality of pulse signals. The plurality of pulse generators comprise a first pulse generator configured to generate a first edge of a first pulse signal in synchronization with a first edge of a first clock signal, and a last pulse generator configured to generate a first edge of a last pulse signal in synchronization with a second edge of a previous pulse signal. In addition, the clock dividing unit is configured to generate a second clock signal by dividing the frequency of the first clock signal. The detecting unit is configured to generate a detecting signal according to the second clock signal and a time interval between the first edge of the first pulse signal and a second edge of the last pulse signal. The pulse width control unit is configured to generate a control signal according to the detecting signal, the first clock signal, and the second clock signal. In particular, pulse widths of the plurality of pulse signals are the same and are adjustable according to the control signal.

BRIEF DESCRIPTION OF THE DRAWINGS

The invention will be described according to the appended drawings in which.

DETAILED DESCRIPTION OF THE INVENTION

Figure 1:
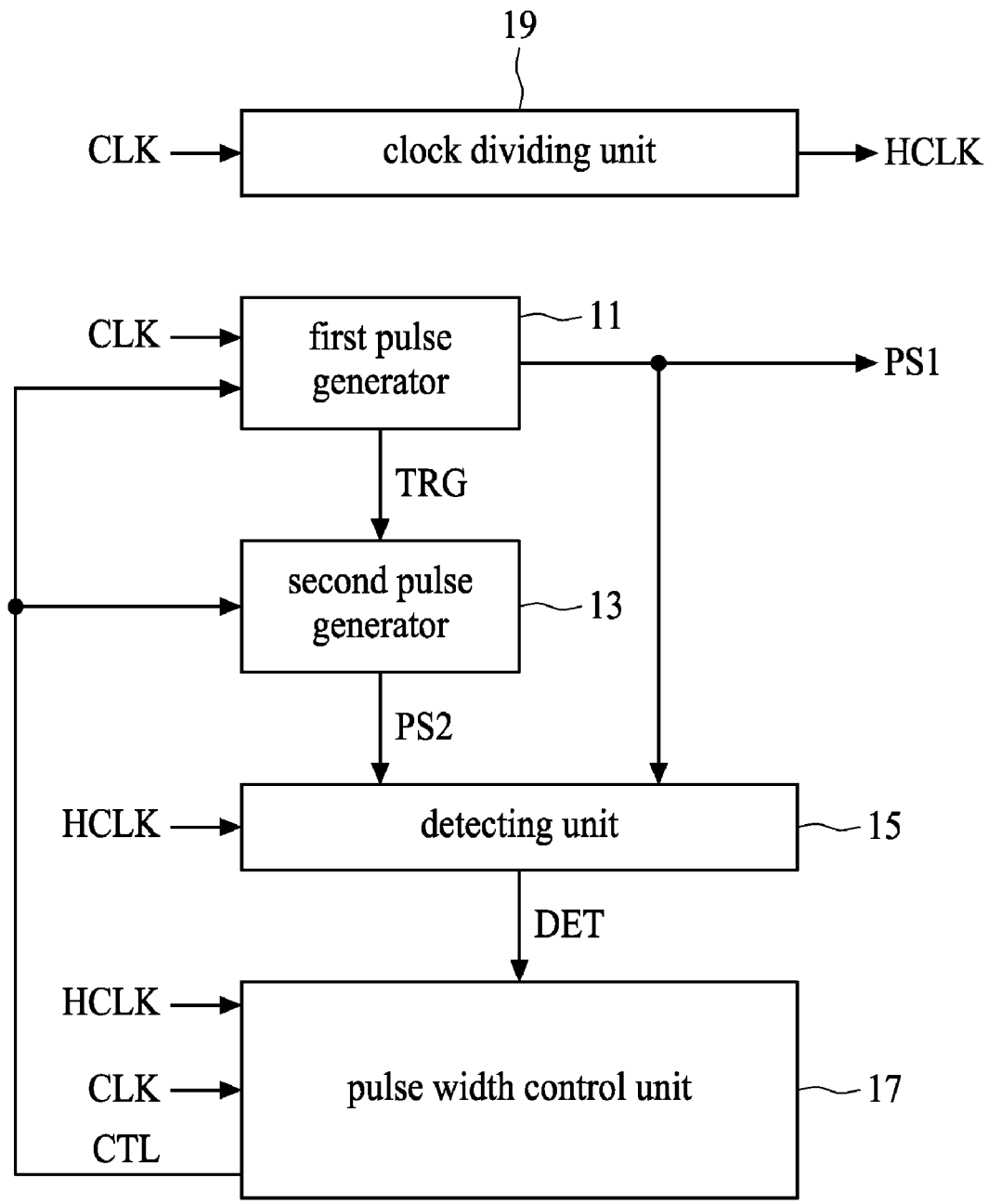
FIG. 1 shows a block diagram of a duty cycle correction circuit according to one embodiment of the present invention.

FIG. 1 shows a block diagram of a duty cycle correction circuit 10 according to one embodiment of the present invention. Referring to FIG. 1, the duty cycle correction circuit 10 comprises a first pulse generator 11, a second pulse generator 13, a detecting unit 15, a pulse width control unit 17, and a clock dividing unit 19.

The first pulse generator 11 is configured to receive a clock signal CLK and a control signal CTL for generating pulse signals PS1 and TRG, and the second pulse generator 13 is configured to receive the pulse signal TRG and the control signal CTL for generating a pulse signal PS2. The pulse signals PS1 and TRG are complementary signals. The clock dividing unit 19 is, in this embodiment, a divide-by-two clock divider whose output frequency is one-half that of the clock signal CLK. The detecting unit 15 is configured to receive the pulse signals PS1 and PS2 and a clock signal HCLK, which is output from the clock dividing unit 19, for generating a detecting signal DET. The pulse width control unit 17 is configured to receive the detecting signal DET and the clock signals CLK and HCLK for generating the control signal CTL. As described more fully below, the pulse signal PS1 is corrected to 50% by adjusting the voltage level of the control signal CTL.

Figure 2:
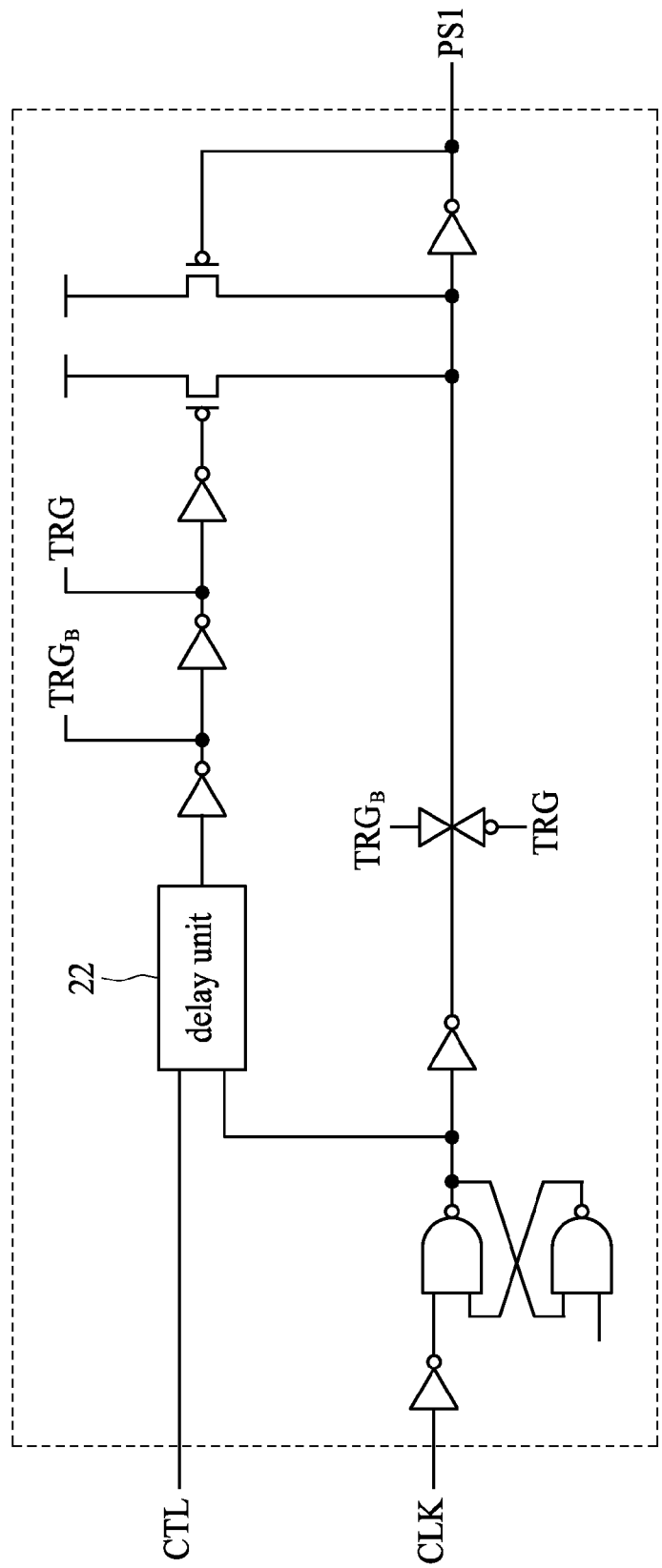
FIG. 2 shows a detailed block diagram in accordance with one embodiment of the first pulse generator in FIG. 1.

FIG. 2 shows a detailed block diagram in accordance with one embodiment of the first pulse generator 11 in FIG. 1. Referring to FIG. 2, the first pulse generator 11 comprises a delay unit 22. The delay unit 22 is configured to delay the clock signal CLK for producing the pulse signal PS1 according to the voltage level of the control signal CTL. Specifically, the pulse width of the pulse signal PS1 is adjustable by varying the voltage level of the control signal CTL. In another embodiment, the delay unit 22 can be a delay chain including N delay stages each having a fixed delay time, and a selection signal is adapted to control the state of the N delay stages.

Figure 3:
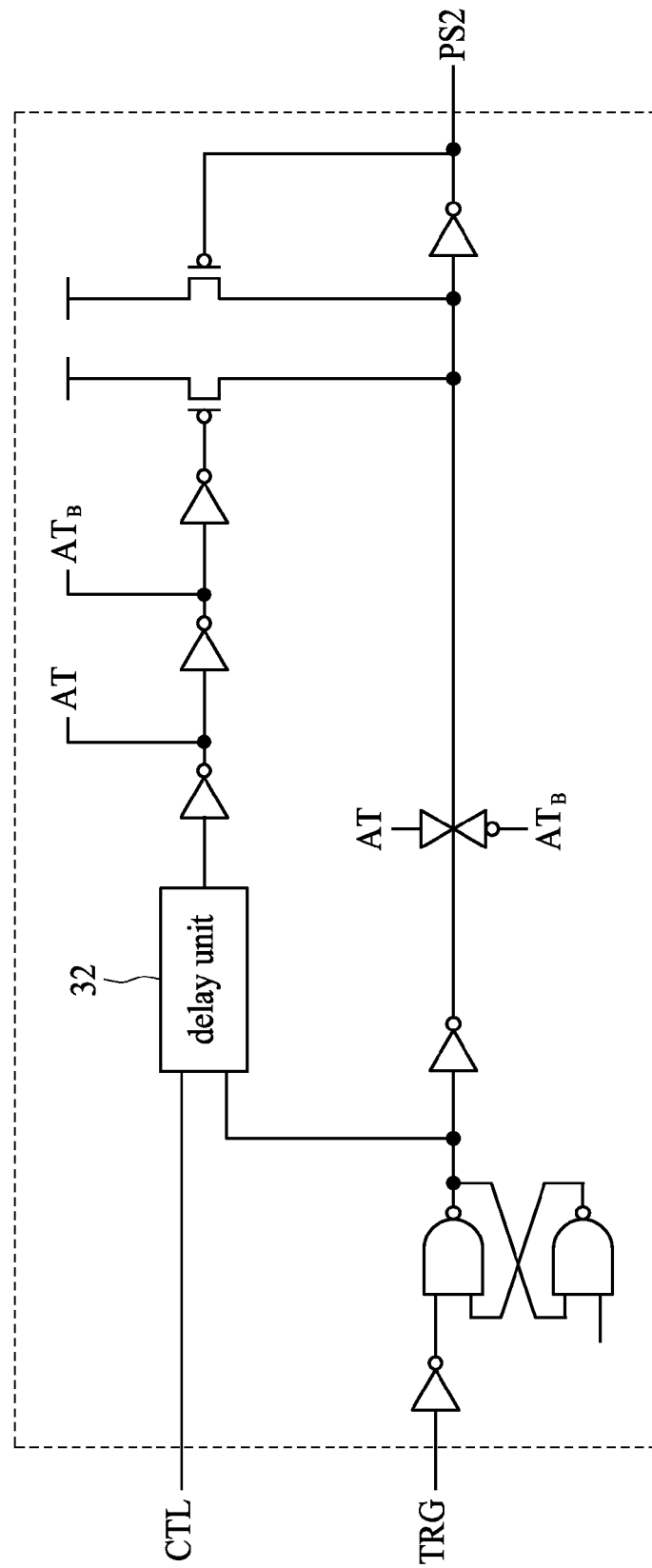
FIG. 3 shows a detailed block diagram in accordance with one embodiment of the second pulse generator in FIG. 1.

FIG. 3 shows a detailed block diagram in accordance with one embodiment of the second pulse generator 13 in FIG. 1. Referring to FIG. 3, the second pulse generator 13 comprises a delay unit 32. The delay unit 32 is configured to produce the pulse signal PS2 according to the voltage level of the control signal CTL and the falling edge of the pulse signal PS1. Specifically, the pulse width of the pulse signal PS2 is adjustable by varying the voltage level of the control signal CTL.

Figure 4:
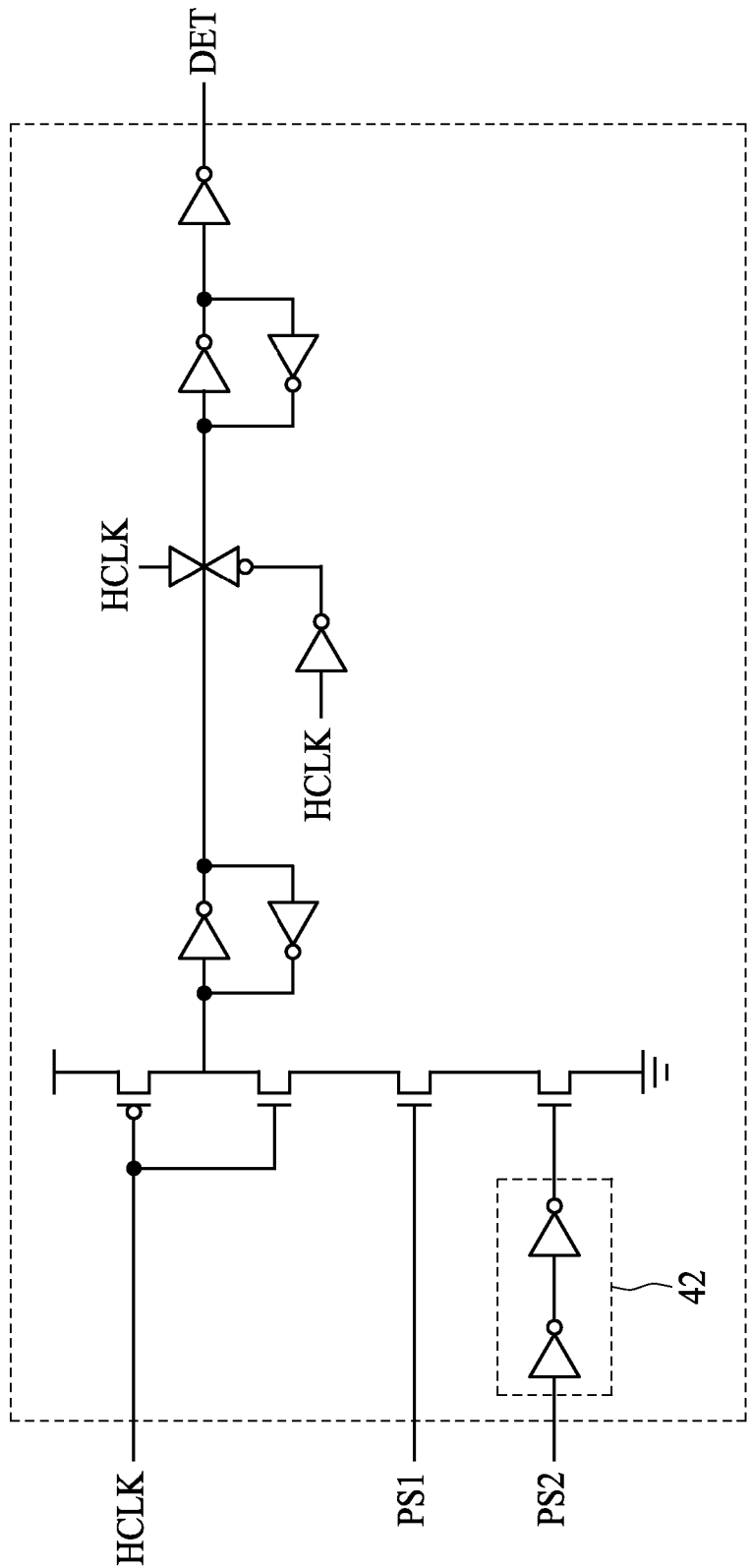
FIG. 4 shows a detailed block diagram in accordance with one embodiment of the detecting unit in FIG. 1.

FIG. 4 shows a detailed block diagram in accordance with one embodiment of the detecting unit 15 in FIG. 1. Referring to FIG. 4, a delay unit 42 is adapted to delay the pulse signals PS2. Therefore, when the duty cycles of the pulse signals PS1 and PS2 are substantially equal to 50%, the falling edge of the pulse signal PS2 overlaps the rising edge of the pulse signal PS1. In addition, when the clock signal HCLK is at a logic low level, the detecting signal DET is activated according to the states of the pulse signals PS1 and PS2.

Figure 5:
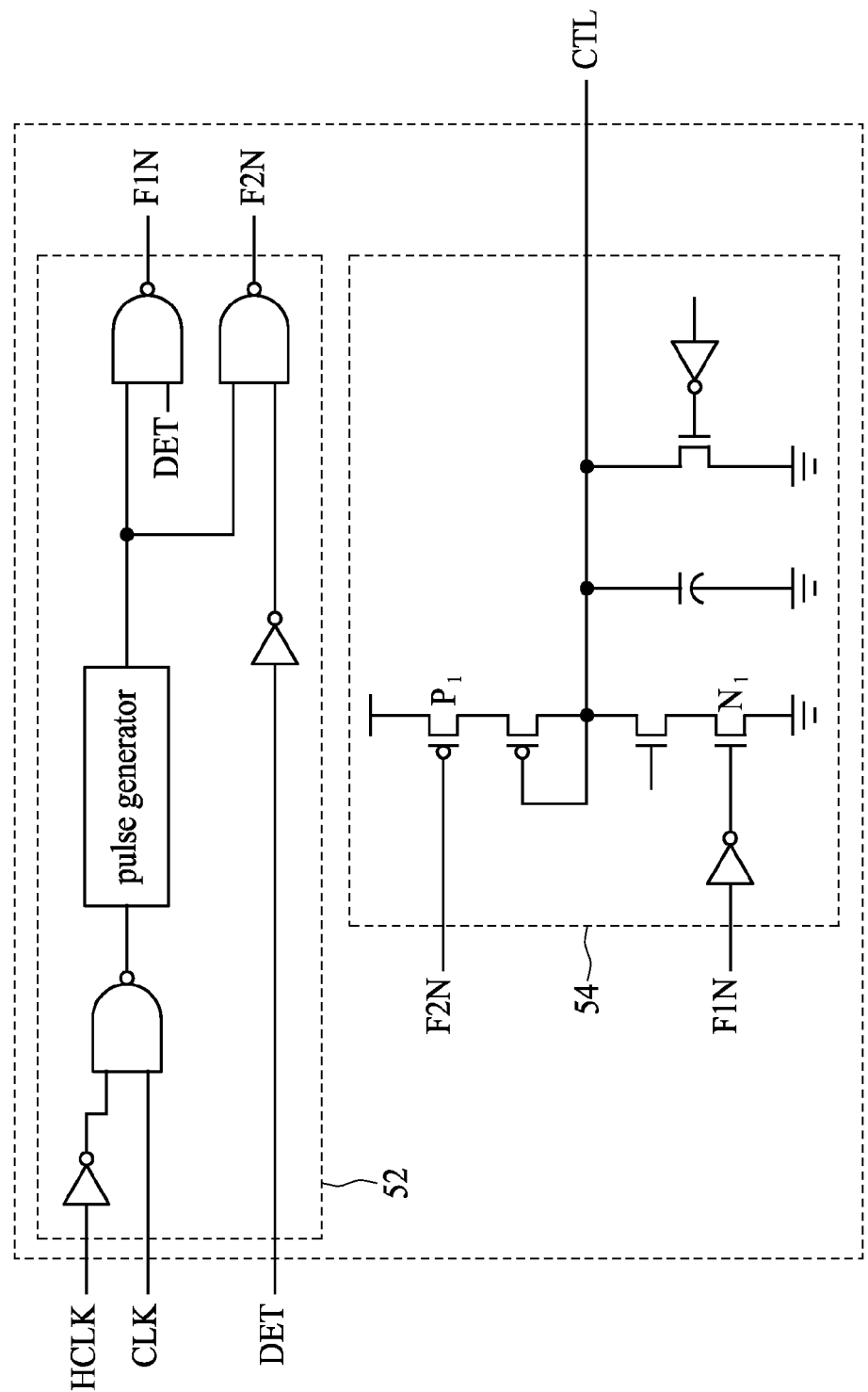
FIG. 5 shows a detailed block diagram in accordance with one embodiment of the pulse width control unit in FIG. 1.

FIG. 5 shows a detailed block diagram in accordance with one embodiment of the pulse width control unit 17 in FIG. 1. Referring to FIG. 5, the pulse width control unit 17 comprises logic circuits 52 and 54. The logic circuit 52 is configured to receive the clock signals CLK, HCLK and the detecting signal DET for generating signals F1N and F2N. The logic circuit 54 is configured to receive signals F1N and F2N for generating the control signal CTL. The signal F2N is connected to a PMOS transistor $P_1$ and is adapted to pull up the voltage level of the control signal CTL. The signal F1N is connected to an NMOS transistor $N_1$ via an inverter and is adapted to pull down the voltage level of the control signal CTL. Specifically, the voltage level of the control signal CTL can be raised or lowered according to the signals F1N and F2N.

Figure 6:
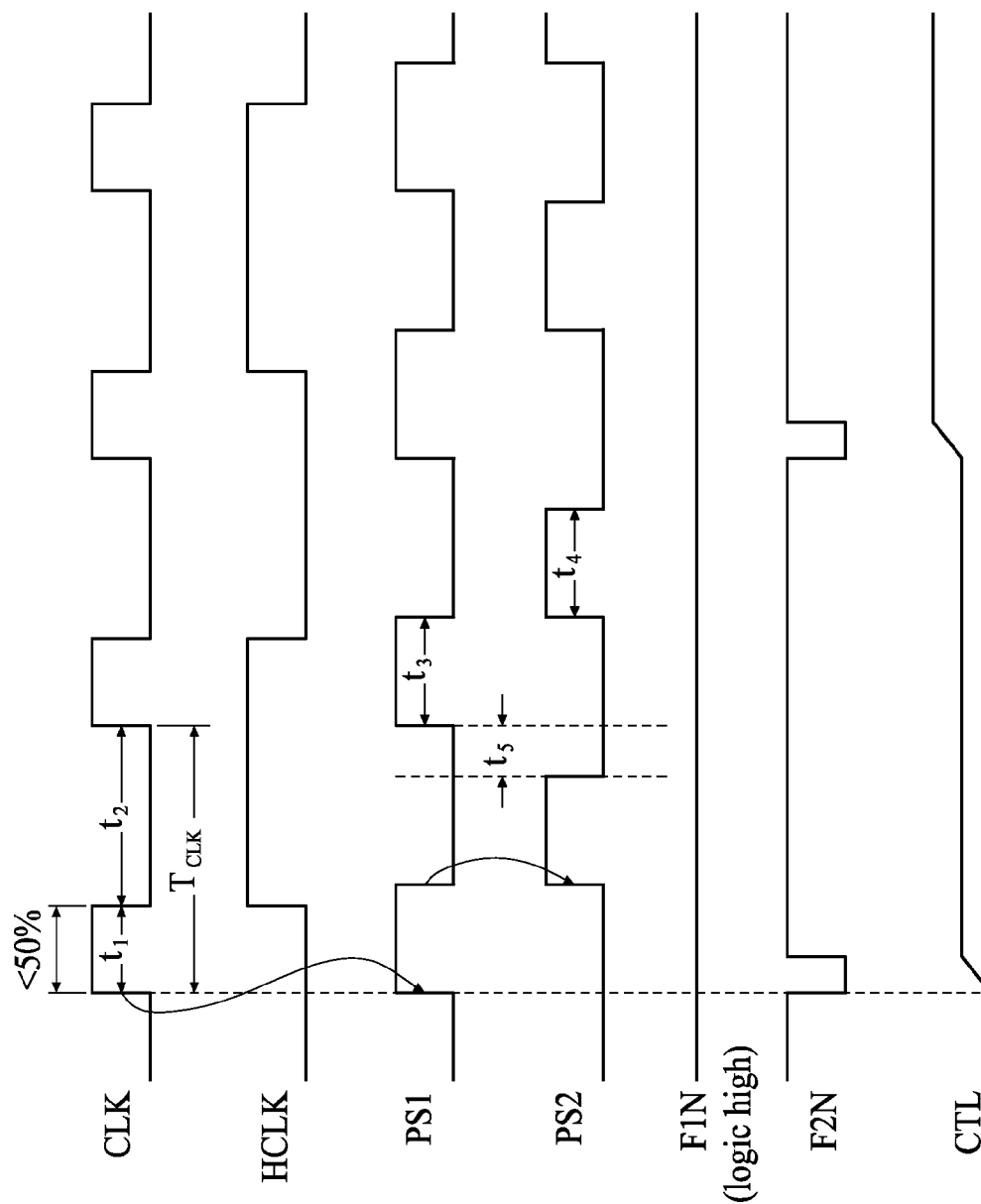
FIG. 6 is a timing diagram of signals that show a manner in which the duty cycle of the pulse signal PS1 is corrected to 50% when the duty cycle of the clock signal CLK is less than 50%.

FIG. 6 is a timing diagram of signals that show a manner in which the duty cycle of the pulse signal PS1 is corrected to 50% when the duty cycle of the clock signal CLK is less than 50%. As shown in FIG. 6, the logic high period $t_1$ of the clock signal CLK is less than the logic low period $t_2$ of the clock signal CLK. Specifically, the duty cycle of the clock signal CLK is less than 50%. Referring to FIG. 6, the operation of the duty cycle correction circuit 10 in FIGS. 1 to 5 will now be described.

When the clock signal CLK is sent to the clock dividing unit 19, the clock signal HCLK whose output frequency is one-half that of the clock signal CLK is generated in synchronization with the falling edge of the clock signal CLK. The first pulse generator 11 generates the first pulse signal PS1 in synchronization with the rising edge of the clock signal CLK. Subsequently, the second pulse generator 13 generates the second pulse signal PS2 in synchronization with the falling edge of the pulse signal PS1. In particular, a logic high period $t_3$ of the pulse signal PS1 is equal to a logic high period $t_4$ of the pulse signal PS2 due to the same delay amount of the delay units 22 and 32. Referring to FIG. 6, the periods $t_3$ and $t_4$ each have an initial delay amount less than $50\% \times T_{CLK}$ at the beginning. Therefore, a time interval $t_5$, which is between the falling edge of the pulse signal PS2 and the rising edge of the pulse signal PS1, is non-zero. When the time period $t_5$ is non-zero, the signal F2N is periodically activated so as to pull up the voltage level of the control signal CTL. As a result, the logic high periods $t_3$ and $t_4$ increase gradually, and the time interval $t_5$ reduces accordingly. Finally, the logic high periods $t_3$ and $t_4$ are substantially equal to $50\% \times T_{CLK}$, and the time interval $t_5$ is substantially equal to zero.

Figure 7:
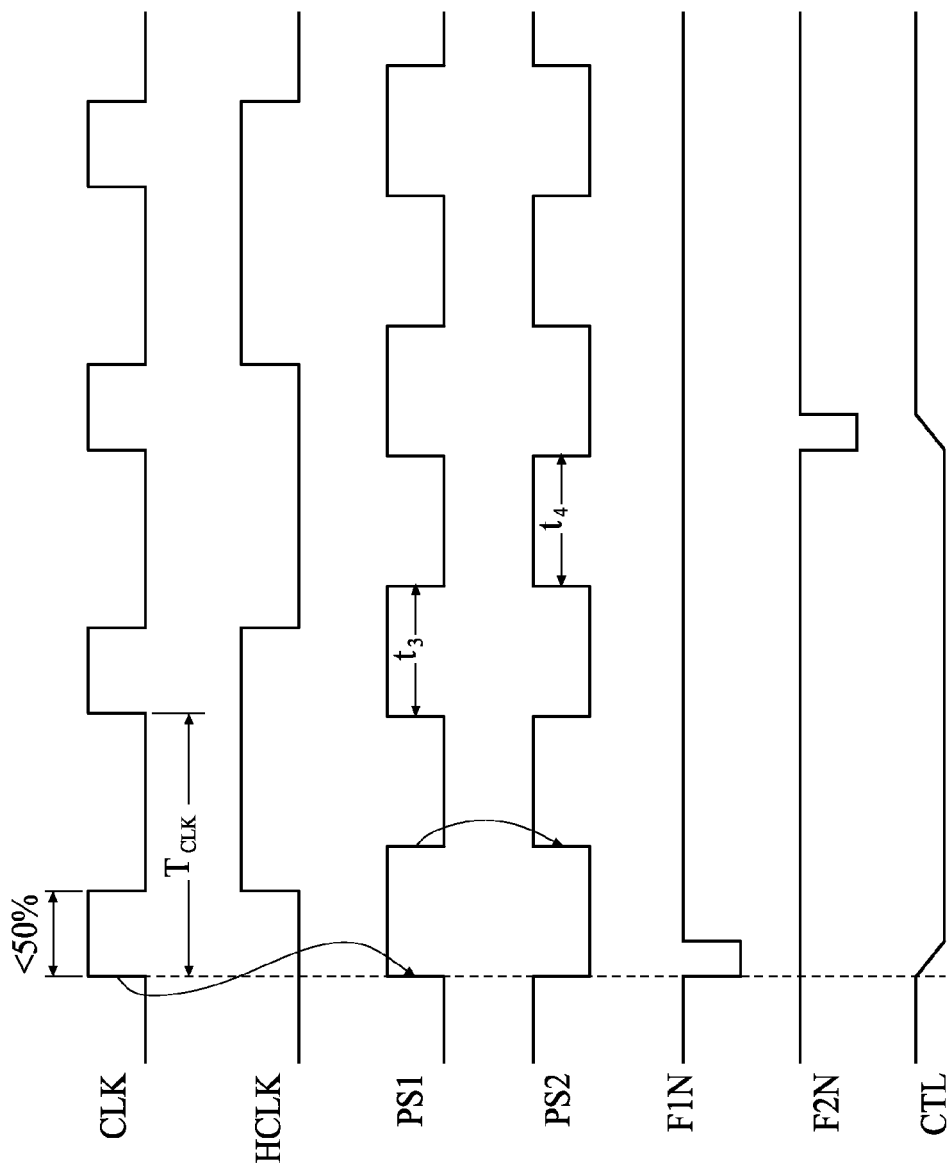
FIG. 7 is a timing diagram of signals that show a manner in which the logic high periods t3 and t4 are substantially equal to 50%×TCLK.

FIG. 7 is a timing diagram of signals that shows a manner in which the logic high periods t3 and t4 are substantially equal to 50%×TCLK. Because there is no time interval between the falling edge of the pulse signal PS2 and the rising edge of the pulse signal PS1, the detecting signal DET is activated periodically when the clock signal HCLK is at a logic low level, and thus the signals F1N and F2N are activated in turn. In such case, the signals F1N and F2N pull down and pull up the control signal CTL, respectively, to regulate the voltage level of the control signal CTL to an almost constant voltage. The pulse width of the pulse signal PS1 is corrected to 50% due to the constant voltage level of the control signal CTL, and the pulse signal PS1 can be sent to the other circuits in the semiconductor memory device as a clock signal with a duty cycle of exactly 50%.

Figure 8:
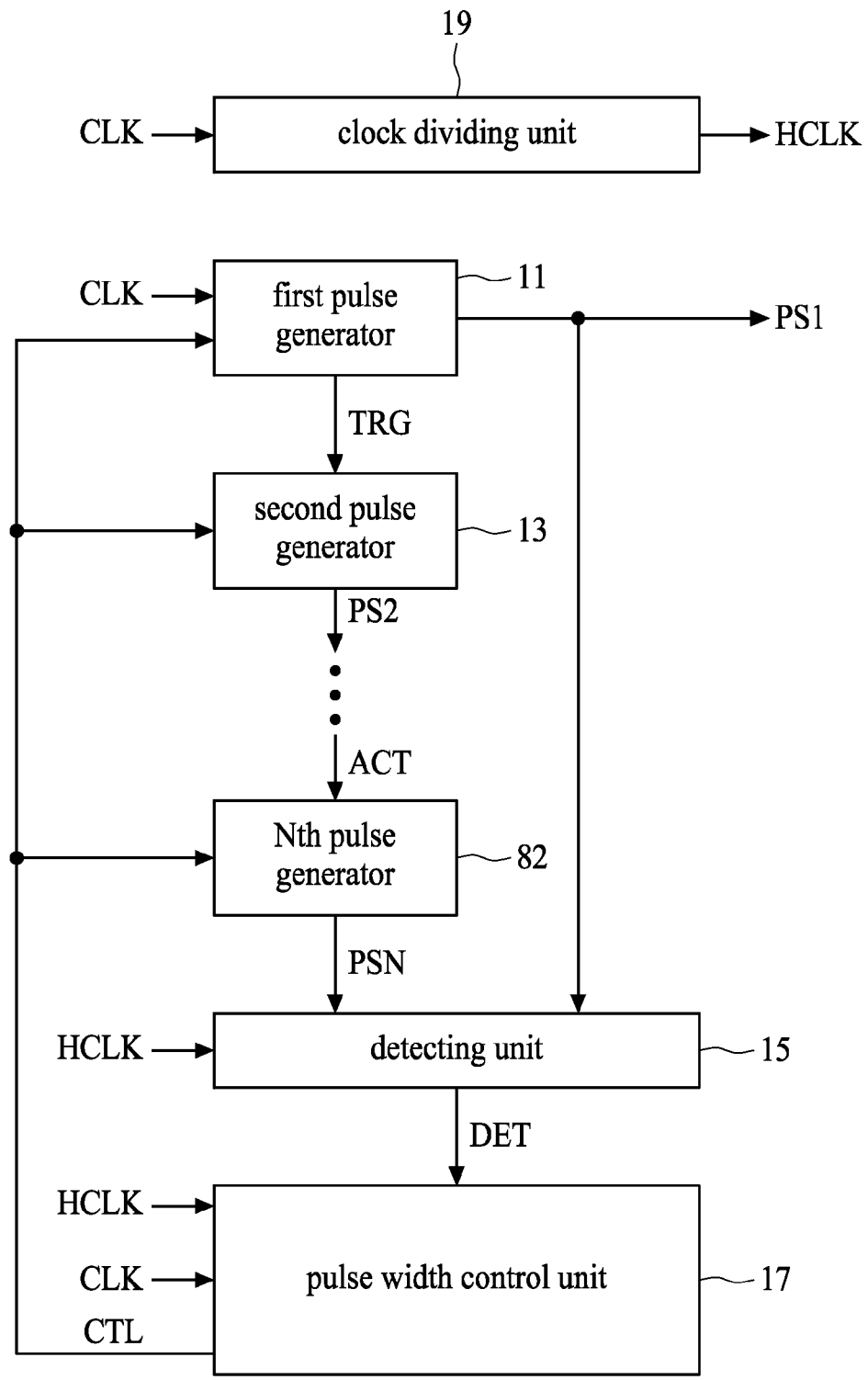
FIG. 8 shows a block diagram of a duty cycle correction circuit with a one-Nth duty cycle according to one embodiment of the present invention.

In addition, a one-Nth duty cycle can be obtained according to the embodiment of the present invention. FIG. 8 shows a block diagram of a duty cycle correction circuit 80 with a one-Nth duty cycle according to one embodiment of the present invention. Referring to FIG. 8, in which like elements of FIG. 1 are shown having like reference designations, the duty cycle correction circuit 80 comprises a first pulse generator 11, a second pulse generator 13, an Nth pulse generator 82, a detecting unit 15, a pulse width control unit 17, and a clock dividing unit 19. The Nth pulse generator 82 is configured to receive a pulse signal ACT from a stage prior to the Nth pulse generator 82 and the control signal CTL for generating an Nth pulse signal PSN. The pulse signals PS1, PS2 . . . , PSN are generated one by one and have the same logic high period. In addition, the rising edge of each pulse signal is in synchronization with the falling edge of the previous pulse signal.

The detecting unit 15 is configured to receive the pulse signals PS1 and PSN and the clock signal HCLK for generating the detecting signal DET. Specifically, the detecting unit 15 detects a time interval between a rising edge of the pulse signal PS1 and a falling edge of the Nth pulse signal for generating the detecting signal DET. Subsequently, the pulse width control unit 17 generates the control signal CTL to adjust the pulse width of the pulse signal generated from each pulse signal generator according to the detecting signal DET and the clock signals CLK and HCLK as mentioned above. According to the embodiment of the present invention, a one-Nth duty cycle can be obtained regardless of the duty cycle of the input clock signal.

The above-described embodiments of the present invention are intended to be illustrative only. Numerous alternative embodiments may be devised by those skilled in the art without departing from the scope of the following claims.

What is claimed is:

1. A duty cycle correction circuit, comprising:
    a first pulse generator configured to generate a first edge of a first pulse signal in synchronization with a first edge of a first clock signal;
    a second pulse generator configured to generate a first edge of a second pulse signal in synchronization with a second edge of the first pulse signal;
    a clock dividing unit configured to generate a second clock signal by dividing the frequency of the first clock signal;
    a detecting unit configured to generate a detecting signal according to the second clock signal and a time interval between the first edge of the first pulse signal and a second edge of the second pulse signal; and
    a pulse width control unit configured to generate a control signal according to the detecting signal, the first clock signal, and the second clock signal;
    wherein pulse widths of the first and second pulse signals are the same and are adjustable according to the control signal.

2. The duty cycle correction circuit of claim 1, wherein the first pulse generators comprise a first delay unit configured to delay the first clock signal for producing a delay amount of the first pulse signal according to the voltage level of the control signal.

3. The duty cycle correction circuit of claim 1, wherein the second pulse generators comprise a second delay unit configured to produce a delay amount of the second pulse signal according to the voltage level of the control signal.

4. The duty cycle correction circuit of claim 1, wherein the pulse width control unit comprises:
    a first logic circuit configured to receive the first clock signal, the second clock signal, and the detecting signal for generating a pull-up signal and a pull-down signal; and
    a second logic circuit configured to receive the pull-up signal and the pull-down signal to generate the control signal.

5. The duty cycle correction circuit of claim 1, wherein the detecting signal is activated according to states of the first and second pulse signals at a first edge of a second clock signal.

6. The duty cycle correction circuit of claim 4, wherein the voltage level of the control signal is increased when the pull-up signal is activated and is reduced when the pull-down signal is activated.

7. The duty cycle correction circuit of claim 4, wherein the detecting unit further comprises a delay unit for delaying the second edge of the second pulse signal.

8. The duty cycle correction circuit of claim 7, wherein the pull-down signal is activated when a duty cycle of the first pulse signal is substantially equal to 0.5.

9. A duty cycle correction circuit, comprising:
    a plurality of pulse generators connected in series and configured to generate a plurality of pulse signals one by one, the plurality of pulse generators comprising:
        a first pulse generator configured to generate a first edge of a first pulse signal in synchronization with a first edge of a first clock signal; and
        a last pulse generator configured to generate a first edge of a last pulse signal in synchronization with a second edge of a previous pulse signal;
    a clock dividing unit configured to generate a second clock signal by dividing the frequency of the first clock signal;
    a detecting unit configured to generate a detecting signal according to the second clock signal and a time interval between the first edge of the first pulse signal and a second edge of the last pulse signal; and
    a pulse width control unit configured to generate a control signal according to the detecting signal, the first clock signal, and the second clock signal;
    wherein pulse widths of the plurality of pulse signals are the same and are adjustable according to the control signal.

10. The duty cycle correction circuit of claim 9, wherein the first pulse generators comprise a first delay unit configured to delay the first clock signal for producing a delay amount of the first pulse signal according to the voltage level of the control signal.

11. The duty cycle correction circuit of claim 9, wherein the last pulse generator comprises a last delay unit configured to produce a delay amount of the last pulse signal according to the voltage level of the control signal.

12. The duty cycle correction circuit of claim 9, wherein the pulse width control unit comprises:
    a first logic circuit configured to receive the first clock signal, the second clock signal, and the detecting signal for generating a pull-up signal and a pull-down signal; and
    a second logic circuit configured to receive the pull-up signal and the pull-down signal to generate the control signal.

13. The duty cycle correction circuit of claim 9, wherein the detecting signal is activated according to states of the first and last pulse signals at a first edge of a second clock signal.

14. The duty cycle correction circuit of claim 12, wherein the voltage level of the control signal is increased when the pull-up signal is activated and is reduced when the pull-down signal is activated.

15. The duty cycle correction circuit of claim 12, wherein the detecting unit further comprises a delay unit for delaying the second edge of the last pulse signal.

16. The duty cycle correction circuit of claim 15, wherein the pull-down signal is activated when a duty cycle of the first pulse signal is substantially equal to one-Nth.

* * * * *